United States Patent Office 3,408,275

Patented Oct. 29, 1968

3,408,275

TUNNEL DIODES WHEREIN THE HEIGHT OF THE REDUCED CROSS SECTION OF THE MESA IS MINIMIZED AND PROCESS OF MAKING

Günther Kesel, Munich, Germany, assignor to Siemens Aktiengesellschaft, Berlin, Germany, a corporation of Germany Continuation-in-part of application Ser. No. 238,898, Nov. 20, 1962. This application Dec. 9, 1966, Ser. No. 607,119

11 Claims. (Cl. 204—143)

ABSTRACT OF THE DISCLOSURE

A new process for electrolytically etching a semi-conductor component having a p-n junction is shown. In a first step a portion of the p-n junction is coarsely electrolytically etched with a counter electrode immersed in the electrolyte. In a fine etching step, voltage is applied to opposite sides of the p-n junction without the coaction of the counter electrode. The etching voltage varies between zero and a value no greater than the maximum operational load of the junction.

The instant application is a continuation-in-part of my abandoned copending application Ser. No. 238,898 filed Nov. 20, 1962 which is based upon German application S 76788 of November 22, 1961.

My invention relates to an electrolytic etching method for accurately shaping the surface of electronic semiconductor members, and is described herein with reference to the accompanying drawings in which.

Figure 1:
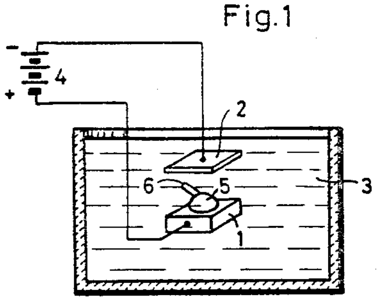
FIG. 1 is an explanatory and schematic illustration of a known electroyltic method for etching semiconductor members.

The semiconductor members in FIGS. 2 to 5 are shown on greatly enlarged scale.

In the production of semiconductor devices, etching processes are employed for various purposes, such as for cleaning the surface at the p-n junction from any ohmic (conducting) shunts, or for cleaning semiconductor surface areas to be subsequently contacted with electrode or terminal metal. Particularly important is the cleaning of the narrow area where the p-n junction reaches the crystal surface because the satisfactory and reliable performance of p-n junction devices may depend upon the absence of conductive contamination on that area.

It is an object of my invention to provide an electrolytic etching method capable or reliably performing such cleaning operations, particularly in cases where the semiconductor crystal is of extremely small size; and it is another object of my invention to afford using such method also for the purpose of imparting to the semiconductor surface, particularly to the above-mentioned junction area, the ultimate shape desired at this locality.

The significance of the latter object will be understood from the following. Semiconductor components for use at high frequencies are often required to have extremely small dimensions and extremely abrupt p-n junctions to meet matching and stability conditions. Notable examples of such semi-conductor components are tunnel diodes.

The negative and capacitive resistance values of the area junction in such devices must permit matching the tunnel diode to the impedances of the external electric circuit. Due to the very abrupt junctions, tunnel diodes have an extremely high junction capacitance, for example, of about 1μf./cm.$^2$, so that, when the semiconductor body of such a tunnel diode is contacted by an alloy pellet in the usual manner, a p-n junction capacitance in the order of 1000 to 10,000 pf. will result. These high capacitance values could be reduced by giving the alloy pellets smaller dimensions so that the desired alloying area is attained from the outset. A sufficient reduction in capacitance, however, would require extremely small diameters of the alloy pellets, for example of a few microns, and such minute pellets are extremely difficult to handle from manufacturing viewpoints.

Another possibility of reducing capacitance is to greatly reduce the junction area by subsequent treatment. This is done by first alloy-bonding the metal pellet to the semiconductor crystal and thereafter giving the crystal at the junction area its ultimate shape by electrolytic etching.

A known method of doing this will be described presently with reference to FIG. 1. The semiconductor member shown is a tunnel diode comprising a germanium crystal 1 in the form of a plate and a pellet 5 consisting of indium or a gallium-containing indium alloy. After the pellet 5 is bonded by alloying to the crystal 1, the surface area adjacent to the pellet is partly etched away. The etching effect can be augmented by applying direct voltage between the semiconductor-pellet member and an electrode 2 which, like the semiconductor member, is immersed in the etching solution 3. The positive pole of a direct-voltage source 4, having a voltage of a few volts, is connected to the germanium crystal 1. The negative pole is connected to the electrode 2. Under such condition, the germanium is anodically oxidized, and germanium becomes dissolved in the liquid. With a suitable etching agent, the alloy-bonded pellet 5, consisting predominantly of indium and being provided with a terminal wire 6, remains unchanged with the exception of a slight superficial elimination of material. The etching operation takes place predominantly beneath the alloy pellet 5 and thus has an undercutting action.

Figure 2:
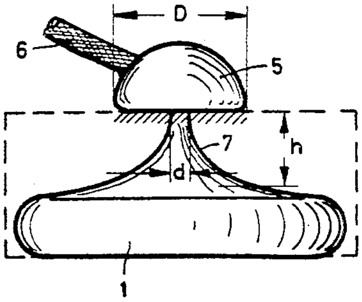
FIGS. 2 and 3 are schematic illustrations of mesa-type semiconductor members at the termination of an etching process performed by the known method.

With increasing elimination of geranium, the semiconductor member assumes a shape as typified in FIG. 2. Shown by a broken line is the outline of the semiconductor crystal 1 prior to etching. Due to etching, the material is removed mainly beneath the pellet 5. It will be recognized that the method produces a mesa on whose flat top the bonded alloy pellet 5 is located. The etching operation just described is hereinafter referred to as rough or coarse etching.

Such coarse etching method involves serious shortcomings which manifest themselves when the crystal is reduced to very small diameters $d$ of the mesa top. The attack of the etching agent takes place uniformly on the entire exposed germanium surface facing the electrode 2 (FIG. 1) so that the mesa hill, protected only at its top by the alloy pellet, is continuously reduced in cross section by etching along its slopes 7. Before the desired small diameters immediately beneath the alloy pellet are attained, the mesa, whose height is approximately indicated by $h$ in FIG. 2 assumes a strongly tapering shape in comparison with its top diameter $d$. As a result, the mesa has very small mechanical strength and may break off when subjected to slight disturbances such as to tensile stresses at the connecting wire 6. The upwardly tapering shape of the mesa, required for attaining small current values of the p-n junction, is unfavorable not only for the mechanical reasons mentioned but also entails electric disadvantages. This is because the tapering portion also constitutes a current supply lead to the p-n junction, but on account of its small thickness this supply lead has considerable electric resistance which is undesirably connected in series with the internal resistance and thus causes an additional attenuating effect of the semiconductor device. The height *h* of the mesa is essentially also determined by the size of the alloy-bonded pellet. Large pellets result in high mesas. Since the height of the mesa determines the current-path resistance and hence the quality of the etched semi-conductor member, the method necessarily requires the use of alloy pellets of very small diameter D if small capacitance values are to be obtained. As mentioned, such small pellet diameters are undesirable because they increase the difficulties of handling during manufacture.

Figure 3:
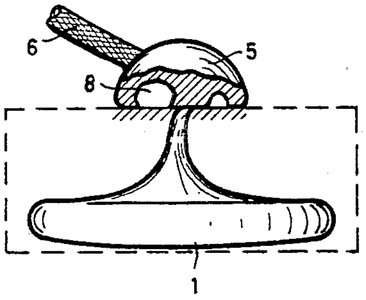
Figure 4:
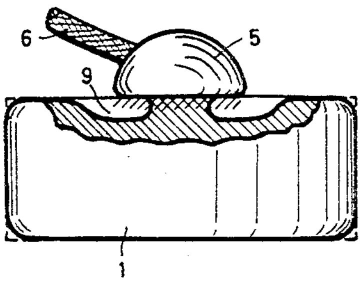
FIGS. 4 and 5 are part-sectional views of mesa semiconductor members etched according to the invention.

As is apparent from FIG. 3, the uniform etching effect is particularly disadvantageous in the vicinity of any wetting gaps 8 at the pellet 5. Such gaps are localities in which there remain hollow spaces due to incomplete wetting of pellet material and of the germanium surface when the pellet 5 was alloyed into the silicon material of the semiconductor body. Such gaps may become exposed by the progressing etching effect and then result in further mechanical instability such as manifested by the irregular shape of the resulting mesa exemplified in FIG. 3.

The coarse etching method, therefore, encounters technological limits even before attainment of the desired small capacitance values of 5 pf. and less at maximal current values of 1 to 5 ma. through the junction.

It is therefore a more specific object of my invention to provide an etching method that affords a more reliable production of the desired ultimate shape conjointly with favorable mechanical and electrical properties of the semiconductor member at its p-n junction, while avoiding the above-mentioned deficiencies of the known method. An object also is to make such improved method applicable with a preceding coarse etching.

To this end, and in accordance with a feature of my invention, the voltage for a fine electrolytic etching operation is applied directly betwen the two electric connections or terminals of the p-n junction and, during progressing electrolytic etching, the current-voltage characteristic of the junction is kept under observation, and the etching is continued until this characteristic is adjusted to the desired, predetermined course.

In contrast to the known method, the electrode denoted by 2 in FIG. 1 (or FIG. 6) need not be employed in the fine electrolytic etching because the voltage used therefor is placed as close as possible to the p-n junction by applying it between the semiconductor body 1 and the alloy pellet 5. When thus performing the electrolytic etching, there occurs an etched circular groove beneath the alloy pellet as shown at 9 in FIG. 4, due to the fact that semi-conductor material from the junction zone itself has gone into solution.

Figure 5:
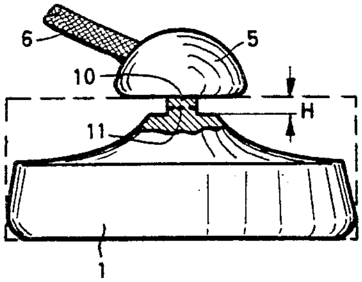

It is preferable to perform fine etching method according to the invention, subsequent to a preceding and preferably electrolytic coarse etching operation in which a rather blunt and relatively thick mesa hill is initially produced. Thereafter, the fine etching has the effect of reducing the upper end 10 of the mesa beneath the alloy pellet (FIG. 5) over its entire periphery without essentially changing the lower slope or flank portions of the mesa. As is shown in FIG. 5, the etching attack beneath the alloy pellet 5 during fine etching is such that, after a short starting interval, the area beneath the pellet will likewise decrease approximately in proportion to time, but this decrease takes place only along a much smaller portion of the mesa slope directly beneath the pellet 5 than is the case during the preceding coarse etching. The height of the mesa is to a great extent independent of the lateral extent of the alloy pellet because the electrolytic field that promotes the etching effect need not act downwardly around the pellet and the undercutting effect of the etching operation depends only upon the geometric conditions in the immediate vicinity of the junction. The height H of the pellet-adjacent mesa portion etched away by fine etching is slight, being in the order of magnitude of 10 microns, so that the resulting mesa hills have low current-path resistances. It is to be noted that the p-n junction, schematically indicated at 11 in FIG. 5, is located in the area of the step-shaped reduction in mesa diameter resulting from the fine etching effect.

Field distortions due to the fact that potential is applied to the connecting cable 8 of the alloy pellet cannot occur because the etching field is active only in the immediate vicinity of the junction. The shape and location of the mesa is determined only by the wetting area between the germanium crystal and the pellet which defines the position of the p-n junction. If a hollow space is located beneath the pellet, resulting from insufficient wetting during the alloying process, then the fine etching method according to the invention nevertheless results in a useful and satisfactory semiconductor member because such localities are not affected by the etching process. The mesa hill of the height H is produced at a place which is completely wetted because no etching occurs at localities where the junction is interrupted.

The electrolytic fine etching according to the invention can be performed with the aid of a continuous direct voltage. However, it is preferable to continuously vary during the entire etching operation the electrolytic voltage between zero and the maximum operating voltage limit of the junction or up to a smaller finite voltage value. For this purpose a periodically variable voltage, for example an alternating voltage, or voltage pulses are preferably impressed between the electrode pellet and the crystal.

The current flowing during fine etching operation is essentially only the electric current passing through the junction. During the continuing etching operation this current through the junction is preferably indicated by a measuring instrument, as a function of the voltage impressed across the junction, and the voltage is disconnected to thereby discontinue the etching effect as soon as the instrument shows that a desired and predetermined current-voltage characteristic is attained. Used for this purpose is preferably an instrument of the recording type that directly records a graph of the current-voltage characteristic of the junction in form of a curve. When operating with alternating voltage, a diode is preferably connected in series with the semiconductor member being subjected to electrolytic etching, in order to prevent polarity reversal of the etching voltage at the junction. The junction and the diode have coincident forward directions of conductance during only one-half wave of the alternating etching voltage.

As mentioned, the semiconductor member is subjected to coarse etching before applying the electrolytic fine etching according to the invention proper. The initial coarse etching may be entirely chemical but preferably is performed electrolytically with the aid of the same processing equipment subsequently employed for fine etching. After performing the coarse electrolytic etching with the aid of an auxiliary electrode as described above with reference to FIG. 1, the ultimate fine etching of the semiconductor member can then be performed without changing the etching bath, simply by switching one pole of the etching voltage from the electrode to the electrode pellet.

Figure 6:
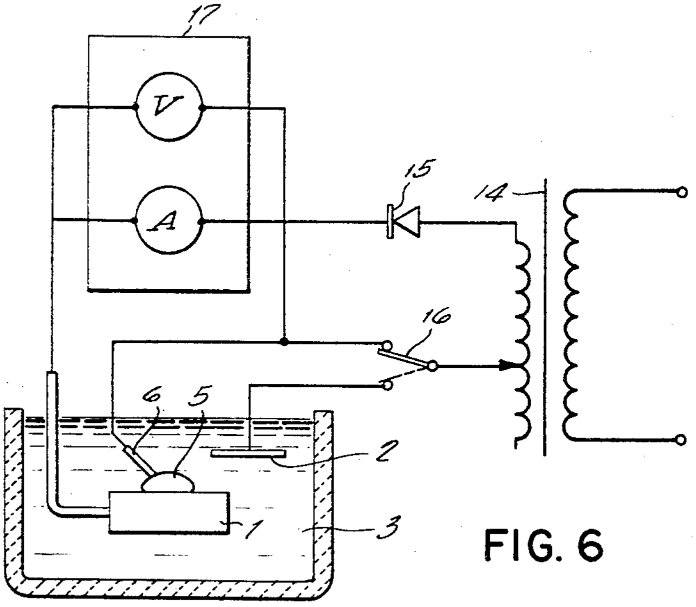
FIG. 6 is an electric circuit diagram of equipment applicable for performing the method of the invention.

The processing equipment illustrated in FIG. 6 embodies the above-mentioned equipment features of the invention. Employed as a source of etching voltage is a transformer 14 whose primary winding is to be connected to a suitable power supply, for example of 110 or 220 v. and a frequency of 50 or 60 c.p.s., and whose secondary furnishes the low etching voltage desired. Connected to the secondary winding in series with a diode 15 and in series with a switch 16 are the semiconductor crystal 1 and the electrode pellet 5 alloy-bonded to the crystal. The electrolyte vessel is provided with an electrode 2 for initial coarse etching when switch 16 is placed into the position indicated by a broken line. During etching, particularly after termination of the coarse etching stage when the fine etching process is being performed, the current flowing through the pellet-crystal junction is continuously measured by a current-responsive unit A of an instrument 17, and the voltage impressed across the junction is simultaneously measured by a voltage-responsive unit V of the same instrument. While the two units A and V may consist of an ammeter and a voltmeter respectively as shown schematically for simplicity, the instrument 17 is preferably a recorder whose curve-producing means are controlled by a current coil and a voltage coil corresponding to units A and V respectively.

The etching agent used for the method is preferably such that it possesses only slight or negligible etching action without applying the electrolytic voltage. Suitable in this manner is sodium lye of 0.1 to 10% concentration.

It is preferable to operate with an etching voltage sufficiently high to obtain intensive charge-carrier injection in the junction of the semiconductor member. This increases the speed of the etching process while nevertheless maintaining the etching action limited to the junction area, particularly to the recrystallization zone.

For the purpose of fine etching according to the invention it is often unnecessary to completely immerse the semiconductor member into the etching bath. Another way of proceeding is to deposit upon the semiconductor surface at the junction, immediately after producing the junction, an only slight quantity of etching medium, for example by dripping or spraying of the medium, so that only the junction area itself and the directly adjacent areas of respectively different conductance and/or different conductance type are wetted and covered. For example, a glass tube drawn out to a fine opening can be used for depositing as many droplets of etching agent upon the junction, previously connected to the voltage source, as are needed to cover only the electrode pellet and the immediately adjacent surface portion of the crystal. The drop of etching liquid covering the junction area becomes more and more saturated with dissolved semiconductor substance during electrolytic etching and this gradually reduces its effectiveness down to a negligible action. Hence the method can be carried out in such a manner that the amount of etching medium applied is just sufficient to have the etching medium saturated by disolved semiconductor substance at the desired termination of the etching operation so that the etching medium becomes inactive.

Another mode of performing the method is to similarly control the etching operation by correspondingly selecting the concentration of the etching agent. That is, the concentration is to be so chosen that it is saturated with dissolved semiconductor substance and hence loses its etching effect at the termination of the process.

An advantage of this saturation process is the fact that the desired degree of etching and consequently the ultimate shape of the junction are brought about more and more slowly as the etching process approaches its termination, the etching progress being almost asymptotical with a corresponding choice of the operating conditions, so that the desired properties of the junction can be given exact magnitudes and can be uniformly reproduced, particularly with respect to electrical parameters, thus permitting the manufacture of semiconductor members and devices of uniformly predetermined qualities.

A further mode of performing the fine etching step for ultimately shaping the junction and imparting to it the desired electrical properties is to repeatedly apply etching liquids to the junction with or without simultaneous interruption of the etching current, thus causing a successive etching away of semiconductor material and a corresponding graduated approach to predetermined electrical quality values. When thus proceeding, the quantity of concentration of the etching liquid placed upon the junction for each individual etching step is preferably so dimensioned that it virtually loses its etching force due to dissolution of semiconductor material before another quantity of etching liquid is placed upon the junction.

The method according to the invention is of particular advantage in the manufacture of tunnel diodes made in accordance with the alloying method. The electrolytic fine etching permits imparting to such tunnel diodes a desired ultimate shape while also adjusting or modifying the electric properties, particularly the barrier-layer capacitance, in the desired manner.

The fine etching method of the invention is further of particular advantage for accurately adjusting the ultimate value of barrier-layer capacitance and reactive-impedance in varicap diodes and varactor diodes. For this purpose, the etching is performed while observing not only the current-voltage characteristic of the diodes but also continuously measuring and indicating the barrier-layer capacitance. The fine etching operation can then be immediately discontinued when a predetermined capacitance value is attained.

Figure 7:
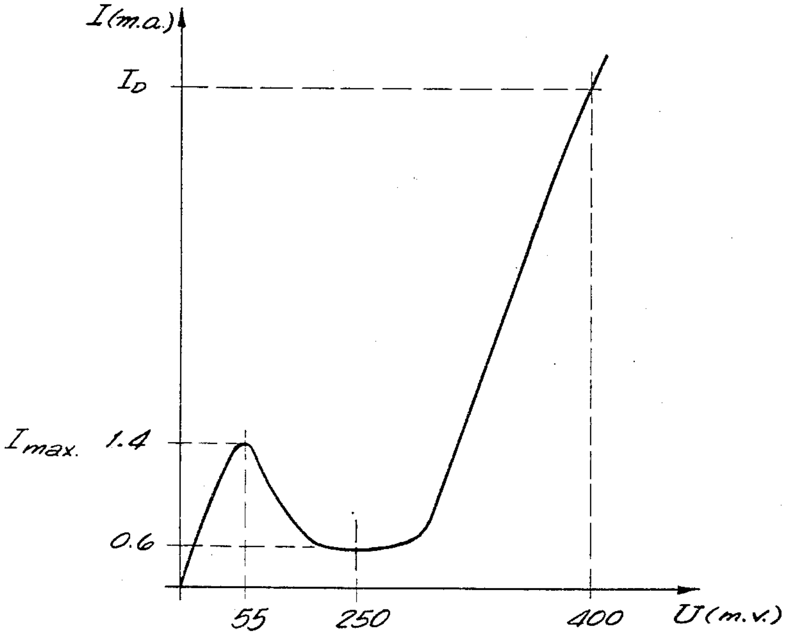
FIG. 7 is an explanatory current-voltage graph.

I have found it particularly favorable to use an *x–y* oscillograph as indicating instrument (17, FIG. 6) during the fine etching process. A typical current-voltage curve as shown on the oscillograph is illustrated in FIG. 7, the abscissa indicating voltage in millivolts and the ordinate indicating current in milliamps.

The etching voltage U during fine etching according to the invention is preferably increased to a value at which the current $I_D$ flowing through the junction is 10 to 100 times that of $I_{max.}$ Under such conditions, the range of intensive carrier injection, desired for tunnel diodes, is reached.

Described in the following is an example of fine etchng applied after conventional coarse etching to a tunnel diode having a crystalline body of germanium with an indium-alloy pellet as described in the foregoing. The fine etching was performed with sodium lye of 0.1% concentration. Employed for etching was an alternating voltage of 50 c.p.s. and an amplitude of approximately 400 mv. Four drops of etching medium were applied in intervals of time onto the surface at the junction as described above. At the beginning of the etching operation caused by the first drop, the current $I_{max.}$ was 58.5 ma. After twenty-four minutes this value had declined to 35.5 ma., at which time the first drop of lye was exhausted. The second drop was added, and $I_{max.}$ decreased further by 13 ma. but at a slower rate of 0.72 ma. per minutes compare with 0.97 ma. per minute during the first stage. A further reduction in rate of current decline took place during the two subsequent etching steps, namely down to 0.55 and 0.24 ma. per minute respectively. After a total etching period of 93 minutes, a reduction of $I_{max.}$ by 55 ma. was obtained. The size of the p-n junction produced by the method was approximately 3 microns. The electrical data of the finished tunnel diode were found to have the following values: valley voltage 250 mv., valley current 0.6 ma., current maximum 1.4 ma., voltage at current maximum 55 mv. The maximum permissible load was about 3 ma.

I claim:

1. The method of electrolytically etching a semiconductor structural component having a p-n junction at an alloyed-in electrode, wherein the etching process is controlled by the electrical properties of the semiconductor device, which comprises etching the semiconductor device in two stages, (a) coarsely electrolytically etching a portion of the p-n junction using a counter electrode immersed in the electrolyte; and (b) subsequently finely electrolytically etching other portions of the p-n junction by applying the voltage effecting the removal to opposite sides of the p-n junction without the coaction of the counter electrode.

2. In the method of claim 1 for electrolytically etching a p-n junction of semiconductor structural component, wherein the final geometric shape of the junction and the region immediately adjacent thereto is produced with a concurrent adjustment of electrical properties of the junction, such as the desired blocking layer capacity, the fine etching step is carried out by applying a voltage for electrolytic etching at electrodes connected to opposite sides of the junction, and repeatedly applying the etching means in such an amount and concentration that the fine etching effect ends through the dissolving of semiconductor material after a short time, again applying etching means in the same manner, while constantly varying, during the entire fine etching process, the etching voltage between zero and a value no greater than the maximum operational voltage value of the junction, whereby the junction is reduced concurrently with the reduction of the peak current carrying capacity to a predetermined value.

3. The process of claim 2, wherein an alternating voltage is applied.

4. The process of claim 2, wherein a periodically changeable voltage is applied.

5. The process of claim 2, wherein the current through the junction is recorded as a function of the voltage applied thereto for the fine electrolytic etching, and interrupting the voltage and thereby the electrolytic etching upon obtainment of the desired current-voltage characteristics.

6. The process of claim 2, wherein voltage for fine electrolytic etching is increased to the point where the junction is controlled up into the region of strong carrier injection.

7. The process of claim 5, wherein only a small quantity of etchant is applied to the junction and the area immediately surrounding the junction.

8. The process of claim 7, wherein the fine etching consists of a 1–10% aqueous solution of sodium hydroxide.

9. The method of claim 8, wherein the height of the greatly reduced cross section of the mesa does not exceed 10$\mu$.

10. Tunnel diodes produced by alloying, whose final form and electrical characteristics are adjusted by electrolytic etching according to claim 8.

11. Varicap and varactor diodes, whose blocking layer capacity and the resistance of the p-n junction are adjusted to desired values by electrolytic etching according to claim 8.

References Cited

UNITED STATES PATENTS

| | | | |
|---|---|---|---|
| 2,656,496 | 10/1953 | Sparks | 148—1.5 |
| 3,078,219 | 2/1963 | Chang | 204—143 |
| 3,081,418 | 3/1963 | Manintveld et al. | 204—143 |
| 3,117,067 | 1/1964 | Jacobs | 204—143 |
| 3,196,094 | 7/1965 | Davis | 204—143 |
| 3,228,862 | 1/1966 | Vulcan | 204—143 |
| 3,250,693 | 5/1966 | Amaya | 204—143 |

ROBERT K. MIHALEK, *Primary Examiner.*